United States Patent
Bayron

(10) Patent No.: US 11,869,868 B2
(45) Date of Patent: Jan. 9, 2024

(54) MULTI-SEGMENT WIRE-BOND

(71) Applicant: SEMICONDUCTOR COMPONENTS INDUSTRIES, LLC, Phoenix, AZ (US)

(72) Inventor: Elmer Cunanan Bayron, Sta. Rosa (PH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 18/051,571

(22) Filed: Nov. 1, 2022

(65) Prior Publication Data

US 2023/0098210 A1 Mar. 30, 2023

Related U.S. Application Data

(63) Continuation of application No. 16/948,803, filed on Oct. 1, 2020, now Pat. No. 11,515,284.

(60) Provisional application No. 62/705,755, filed on Jul. 14, 2020.

(51) Int. Cl.
*H01L 23/00* (2006.01)

(52) U.S. Cl.
CPC .............. *H01L 24/78* (2013.01); *H01L 24/85* (2013.01); *H01L 2224/78303* (2013.01); *H01L 2224/78343* (2013.01); *H01L 2224/85205* (2013.01)

(58) Field of Classification Search
CPC ..................... H01L 24/78; H01L 24/85; H01L 2224/78303; H01L 2224/78343; H01L 2224/85205

USPC ......................................................... 438/617
See application file for complete search history.

(56) References Cited

U.S. PATENT DOCUMENTS

| | | | |
|---|---|---|---|
| 7,051,915 B2 | 5/2006 | Mutaguchi | |
| 2004/0041000 A1* | 3/2004 | Mutaguchi | B23K 20/004 228/180.5 |
| 2005/0121493 A1 | 6/2005 | Mironescu et al. | |
| 2005/0284913 A1* | 12/2005 | Lim | H01L 24/85 228/4.5 |
| 2006/0032888 A1 | 2/2006 | Chapman et al. | |
| 2011/0057299 A1* | 3/2011 | Takata | H01L 24/48 257/676 |
| 2013/0220673 A1* | 8/2013 | Middendorf | H05K 3/32 174/250 |
| 2015/0187729 A1* | 7/2015 | Chew | H01L 24/48 257/784 |

(Continued)

OTHER PUBLICATIONS

U.S. Appl. No. 16/948,803, filed Oct. 1, 2020.

*Primary Examiner* — Didarul A Mazumder
(74) *Attorney, Agent, or Firm* — Brake Hughes Bellermann LLP

(57) ABSTRACT

A multifaceted capillary that can be used in a wire-bonding machine to create a multi-segment wire-bond is disclosed. The multifaceted capillary is shaped to apply added pressure and thickness to an outer segment of the multi-segment wire-bond that is closest to the wire loop. The added pressure eliminates a gap under a heel portion of the multi-segment wire-bond and the added thickness increases a mechanical strength of the heel portion. As a result, a pull test of the multi-segment wire-bond may be higher than a single-segment wire-bond and the multi-segment wire-bond may resist cracking, lifting, or breaking.

20 Claims, 8 Drawing Sheets

(56) References Cited

U.S. PATENT DOCUMENTS

2017/0125311 A1* 5/2017 Shah .................. H01L 24/78

* cited by examiner

800

```
┌─────────────────────────────────────────┐
│ FEEDING A WIRE THROUGH A WIRE CHANNEL OF A │
│ MULTIFACETED CAPILLARY OF A WIRE BONDING   │
│              MACHINE                        │
│                810                          │
└─────────────────────────────────────────┘
                    │
                    ▼
┌─────────────────────────────────────────┐
│ APPLYING A FORCE TO PRESS THE WIRE BETWEEN A│
│ BOTTOM SURFACE OF THE MULTIFACETED CAPILLARY│
│   AND A BONDING SURFACE OF A SUBSTRATE      │
│                820                          │
└─────────────────────────────────────────┘
                    │
                    ▼
┌─────────────────────────────────────────┐
│ DELIVERING POWER TO THE WIRE TO FORM A MULTI-│
│ SEGMENT WIRE-BOND WITH NO GAP BETWEEN THE   │
│  BONDING SURFACE AND A HEEL PORTION, WHICH  │
│ INCLUDES A PLATEAU REGION THAT HAS A THICKNESS│
│    MORE THAN HALF THE DIAMETER OF THE WIRE  │
│                830                          │
└─────────────────────────────────────────┘
```

FIG. 8

MULTI-SEGMENT WIRE-BOND

CROSS-REFERENCE TO RELATED APPLICATION

This application is a continuation of U.S. patent application Ser. No. 16/948,803, filed on Oct. 1, 2020, which claims the benefit of U.S. Provisional Application No. 62/705,755, filed on Jul. 14, 2020. The contents of these applications are hereby incorporated by reference in their entirety.

FIELD OF THE DISCLOSURE

The present disclosure relates to semiconductor manufacturing and more specifically to a wire-bond and a method and apparatus for forming thereof.

BACKGROUND

Semiconductor manufacturing (e.g., packaging) can require the bonding of wires (i.e., wire-bonding) to a bond pad of a semiconductor die and/or to a lead post of a semiconductor package (i.e., lead frame). A wire-bond can include a heel portion that transition between a bonded portion and a wire portion that may be weaker than the other portions. As a result, cracks can form in the heel portion of the wire-bond. Heel cracks are undesirable because they negatively affect electrical performance and/or operation of the semiconductor device.

SUMMARY

In at least one aspect, the present disclosure generally describes a multi-segment wire-bond. The multi-segment wire-bond includes a heel portion having multiple segments. The multiple segments include a first segment that increases from a first thickness to a second thickness according to a first side cross-sectional profile over a first segment length. The multiple segments also include a second segment that increases from the second thickness to a third thickness according to a second side cross-sectional profile over a second segment length. The second profile is different from the first profile. The multiple segments also include a third segment that increases from the third thickness to a fourth thickness according to a third side cross-sectional profile over a third segment length. The third profile is different from the second profile and the first profile. The heel portion has a continuous contact between a bonding surface and the first segment, the second segment, and the third segment.

In another aspect, the present disclosure generally describes a multifaceted capillary for a wire-bonding machine. The multifaceted capillary includes a wire channel, a first face, a second face, and a third face. The first face has a first face profile that includes a first surface at a first face angle with respect to a bonding surface. The second face has a second face profile that includes a second surface at a second face angle with respect to the bonding surface. The second face angle is different from the first face angle and the first face is disposed between the second face and the wire channel. The third face has a third face profile that includes a curve having a plateau region that is substantially aligned parallel with the bonding surface. The second face is disposed between the first face and the third face.

In another aspect, the present disclosure generally describes a method for wire-bonding. The method includes feeding a wire through a wire channel of a multifaceted capillary of a wire-bonding machine. The method further includes applying a force to press the wire between a bottom surface of the multifaceted capillary and a bonding surface of a substrate. The bottom surface of the multifaceted capillary includes a first face, a second face, and a third face. The first face is adjacent to a wire channel and has a first face profile that includes a first surface at a first face angle with the bonding surface. The second face is adjacent to the first face and has a second face profile that includes a second surface at a second face angle with the bonding surface. The third face is adjacent to the second face and has a third face profile that includes a curve having a plateau region that is substantially aligned with the bonding surface. The method further includes delivering power to the wire to form a multi-segment wire-bond, the multi-segment wire-bond having no gap between the bonding surface and a heel portion. The heel portion includes a plateau region that has a thickness that is greater than or equal to half of a diameter of the wire.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 8 is a flowchart of a method for wire-bonding according to an implementation of the present disclosure.

The components in the drawings are not necessarily to scale relative to each other. Like reference numerals designate corresponding parts throughout the several views.

DETAILED DESCRIPTION

Cracks in wire-bonds of semiconductor devices are problematic because they can affect manufacturing yield and/or a reliability of semiconductor devices. As wire diameters decrease and as material choices for wires expand, these problems may become more pronounced. Tracing and eliminating the source of these cracks may be difficult as they can arise from a variety of sources. Instead, much time and expense may be spent on reliability testing and process control to minimize the cracks. A wire-bond (i.e., bond-point, stitch) that can resist cracking may help improve production and life of a semiconductor device and can help reduce the time and expense necessary to minimize defects.

The disclosed wire bond resists cracking by mechanically strengthening a portion (e.g., critical portions, portions that are susceptible to cracking) of the wire-bond and by shaping the wire-bond to remove features that can lead to cracking.

Wire-bonding can be accomplished using a wire-bonding machine (i.e., tool, apparatus) that is configured to distribute (i.e., feed), hold (i.e., clamp), position, and soften the wire to form a bond-point (i.e., stitch). For example, a wire can be fed (e.g., moved) out of an opening of a capillary included in the wire-bonding machine. The capillary can then be positioned over and lowered so that a portion of the wire is pressed between a surface of the capillary and the lead. Energy (e.g., ultrasonic energy) is then applied to soften the pressed portion of the wire and bond the pressed portion of the wire to the lead post. After an intermetallic bond is formed between the wire and the lead post, the wire in the capillary can be clamped as the capillary is lifted away to disconnect the wire-bond from the wire in the capillary.

Figure 1:
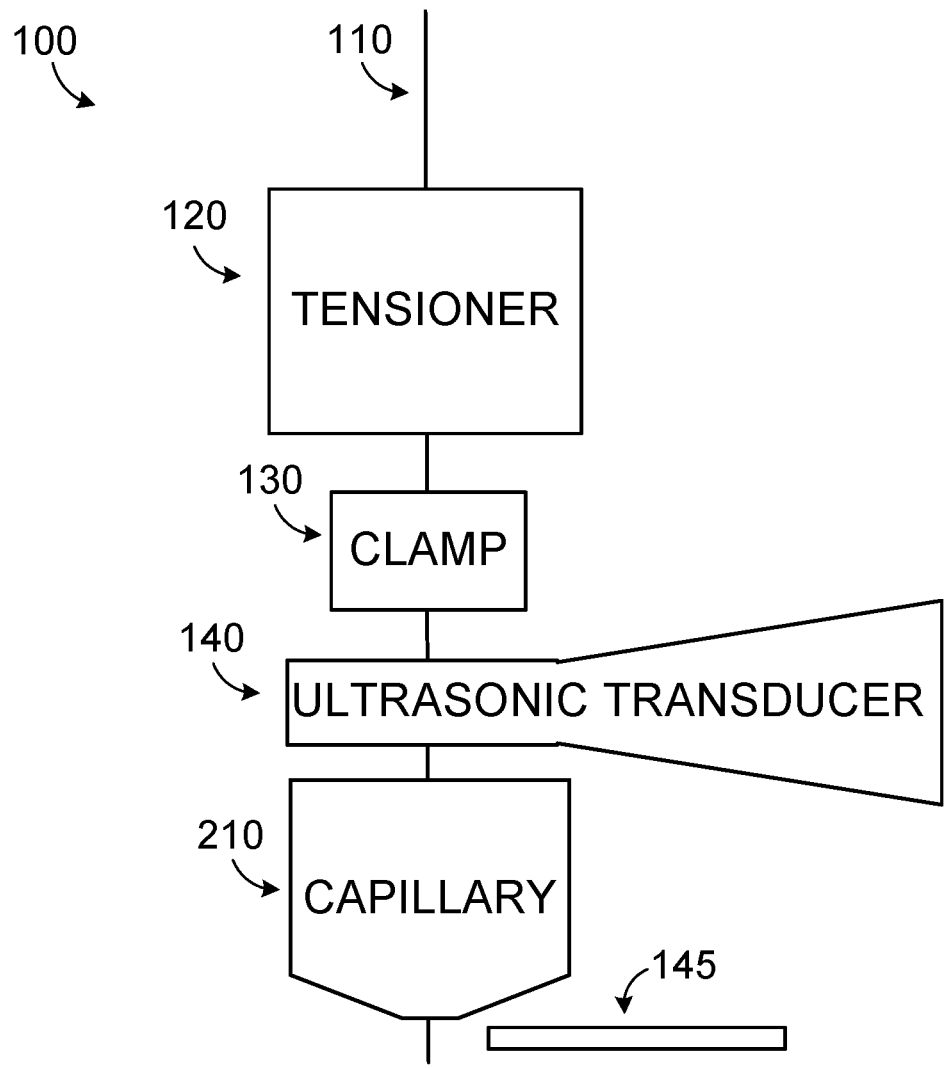
FIG. 1 is a block diagram illustrating a portion of a wire-bonding machine suitable for creating a multi-segment wire-bond according to an implementation of the present disclosure.

FIG. 1 is a block diagram of an example wire-bonding machine that is used in connection with the implementations described herein. The wire-bonding machine 100 is configured to receive a wire 110. The wire 110 may be any of various materials, including (but not limited to) gold (Au), copper (Cu), and Aluminum (Al). A wire-bonding machine 100 can include a tensioner 120 to keep the wire taught in the machine and prevent tangles. The wire-bonding machine can further include a wire clamp 130 to hold the wire in place. The wire-bonding machine can further include an ultrasonic transducer 140 configured to apply energy to the wire via an ultrasonic signal. The energy may soften the wire material (e.g., via heating). The wire-bonding machine includes a capillary 210 that guides the wire and interfaces with (i.e., presses, stamps) the wire during wire-bonding. In some wire-bonding implementations (e.g., ball bonding), an electronic-flame-off wand (i.e., EFO wand 145) may be included to heat the end of the wire to create a free-air-ball (i.e., FAB) prior to wire-bonding to a substrate. The side-cross-sectional view of the capillary 210, used in the implementations described herein, is shown in connection with at least FIG. 4.

A wire-bond connection may electrically couple a die pad of an integrated circuit and a lead post of a package. As such each wire-bond connection may include a first wire-bond bonding the wire to the die pad and a second wire-bond bonding the wire to the lead post. The first wire-bond may be a ball type (i.e., ball bond) and the second wire-bond may be a wedge type (i.e., wedge bond, heel stitch). In a ball bond, a ball is formed on the first end of the wire (e.g., gold wire) before the wire is bonding to the pad. This approach allows the loop to be formed at a variety of angles with respect to the ball bond. In a wedge bond (i.e., stitch), the wire is bonded in a particular direction. The wedge bond includes a heel portion (i.e., neck portion) that is formed during the pressing operation of the wire-bonding process. In other words, pressure on the (softened) wire stamps the wire according to a profile shape the bottom surface of the capillary, thereby creating the heel portion. The profiles described herein can be side cross-sectional profiles even though not explicitly noted as such in each of the implementations.

In general, a wire-bond connection between two bond points may include ball bond on either end (i.e., ball-ball bonding), wedge bonds on either end (i.e., wedge-wedge bonding), or a ball bond on one end and a wedge bond on the other end (i.e., ball-wedge bonding). While the disclosed techniques can work (e.g., function) for a variety of bond point types and for a variety of energy forms (e.g., heat, ultrasonic, etc.), a wedge bond created using ultrasonic energy will be described in detail in the disclosure and will be referred to simply as a wire-bond. The wire of the disclosed wire-bond may be 2 thousandths of an inch (i.e., 2 mils) in diameter or less (e.g., 1 mils or 2 mils) and may a highly conductive material, such as copper or gold.

Figure 2A:
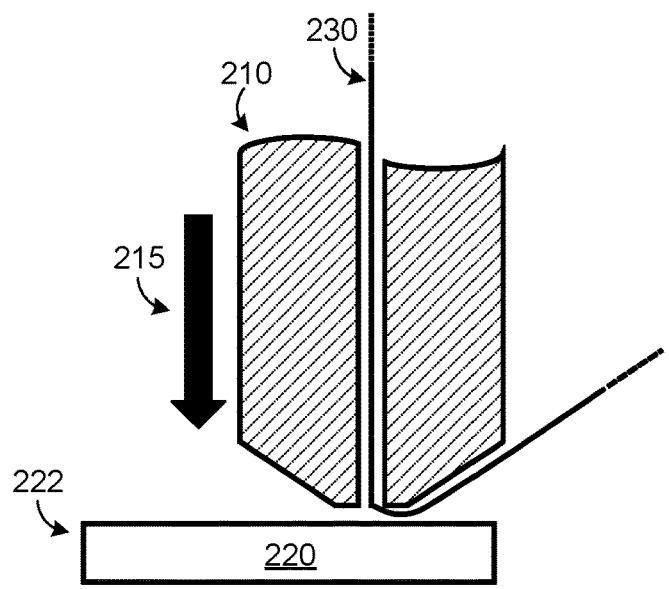
FIGS. 2A and 2B illustrate portions of a wire-bonding process suitable for creating a multi-segment wire-bond according to an implementation of the present disclosure.
Figure 2B:
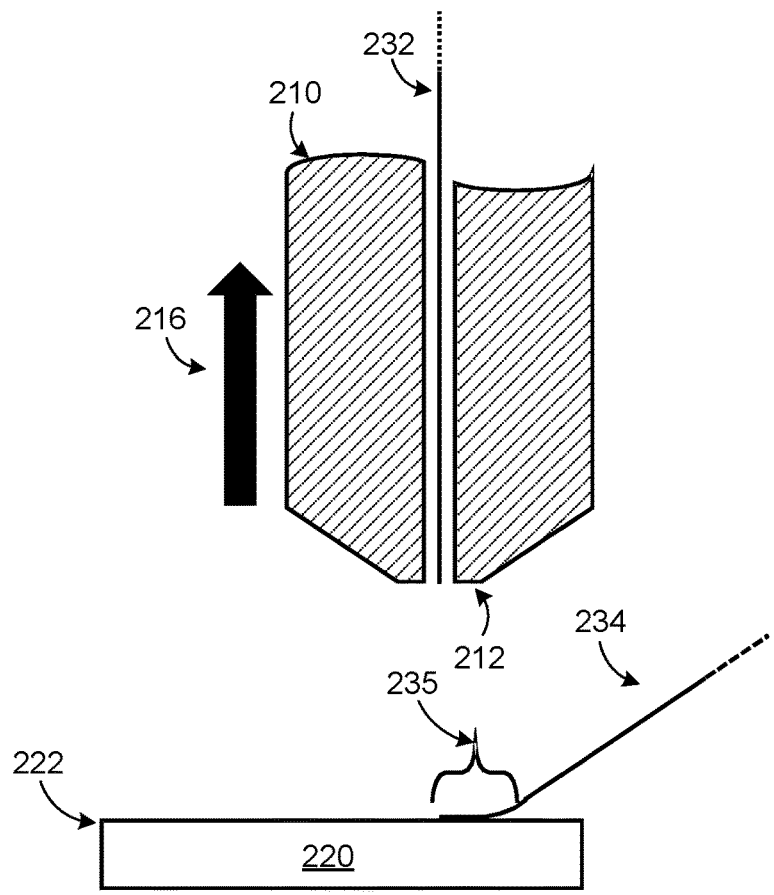

Portions of a wire-bonding process are illustrated in FIGS. 2A and 2B. The precise profile of the capillary used in FIGS. 2A and 2B is shown in more detail in, for example, FIG. 4. FIG. 2A illustrates a first portion of a wire bonding process in which a wire 230 is fed (i.e., from first end) through the capillary 210 as the capillary is moved into position over a substrate 220 (i.e., lead frame). The wire 230 is coupled (i.e., at a second end) to a first connection (e.g., another wire-bond) that is not shown. After positioning the capillary over the lead, the capillary 210 can be moved in a first direction 215 so that the wire 230 is pressed (i.e., by a force in the first direction 215) between a bottom surface 212 of the capillary 210 and a top surface 222 of the substrate 220. The substrate 220 may be any of various materials including (but not limited to) gold (Au), copper (Cu), and Aluminum (Al). The wire receives energy (e.g., via an ultrasonic transducer 140) to soften (e.g., melt) so that, when cooled, the wire and the lead form an intermetallic bond.

FIG. 2B illustrates a second portion of the wire bonding process. After the bond is formed, the wire is divided (e.g., broken) into a first portion of the wire 232 and a second portion of the wire 234. Dividing the wire may include clamping the wire (e.g., via the wire clamp 130) and moving the capillary 210 in a second direction 216 away from the wire-bond 235. The second portion of the wire 234 extends to a second wire bond (not shown). The wire in the area between the wire-bond and the second wire-bond is known as a loop and the shape of the wire in this area is known as the loop profile. The loop profile generated by a wire-bonding machine can be controlled by a looping parameter. When a wire-bond is susceptible to heel cracks, this parameter may require optimization and careful control.

The wire bonding machine and process, shown in FIGS. 1, 2A and 2B, are provided to help provide context and provide clarity to the processes use as part of the inventive. These figures, and their description, are not intended to limit the present disclosure because, as may be recognized to one skilled in the art, the principles and technology disclosed here may include modifications, substitutions, changes, and/or equivalents to these drawings and their description.

Figure 3:
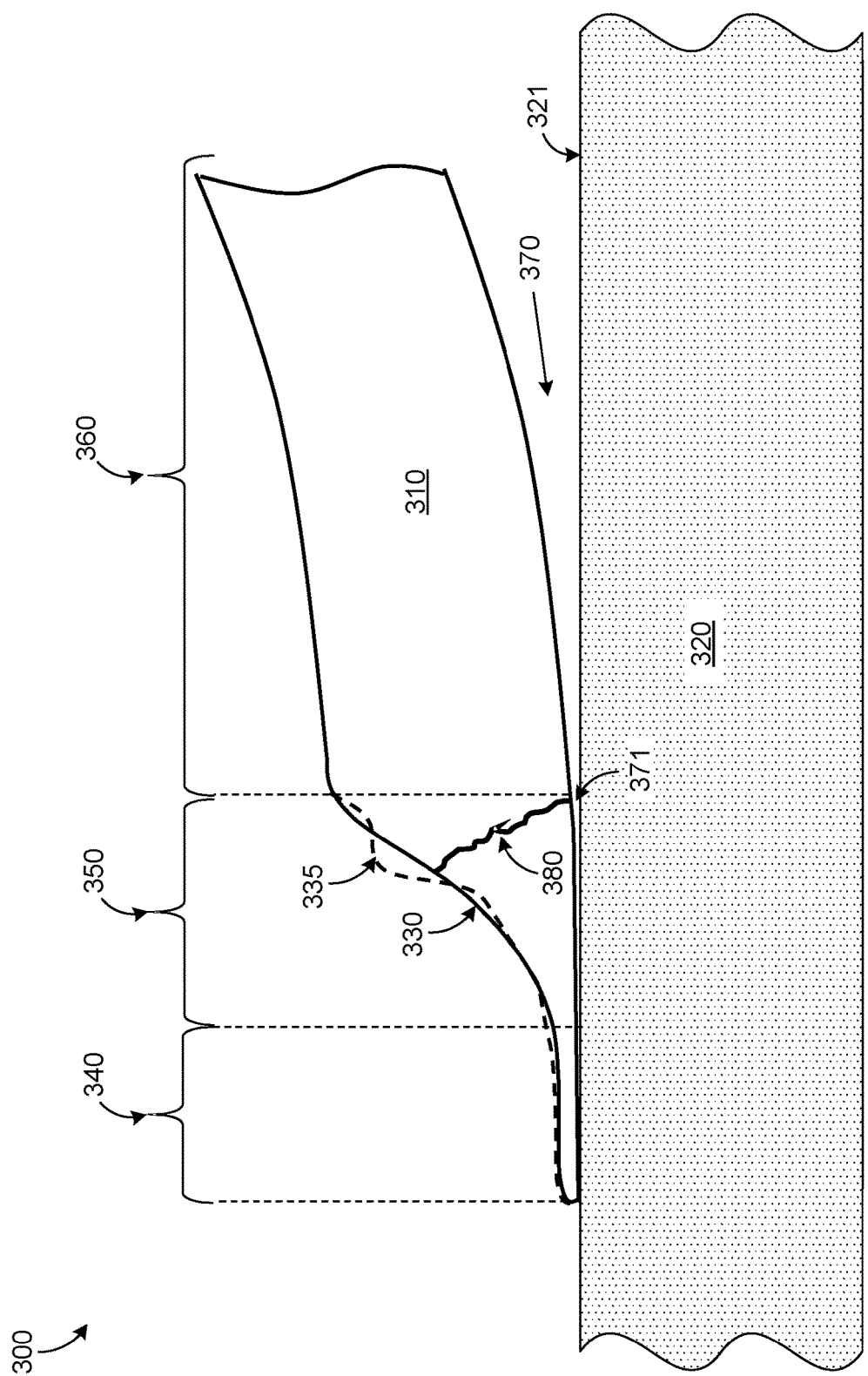
FIG. 3 illustrates a side-view, cross-sectional of a wire bond.

FIG. 3 illustrates a side cross-sectional view of a wire-bond. The wire-bond includes a wire 310 bonded to a substrate 320, such as a metallic surface on a lead post on a lead frame. The wire-bond 300 shown in this implementation, has three portions (i.e., areas) that result from a bond profile 330 formed by pressing the capillary onto the wire during the wire-bonding process.

In a first portion, referred to as a bond portion 340, the wire 310 is flattened and bonded to the surface of a substrate (e.g., lead frame). In the bond portion 340, the wire may have a substantially uniform thickness. In the bond portion 340, the wire and the substrate 320 may form an intermetallic bond. Accordingly, no gap may exist between the wire and the substrate in the bond portion 340.

In a second portion, referred to as a heel portion 350 (i.e., stitch heel), the wire 310 transitions from the flattened and bonded portion to a third portion, known as the wire portion 360 (i.e., wire) in which the wire is not flattened and not bonded. Accordingly, in the heel portion 350 the wire gradually changes thickness according to the bond profile 330 created by the capillary during the wire-bonding process. Additionally, in the heel portion 350 a gap 370 can be formed between the wire 310 and the substrate 320. The gap 370 can widen gradually moving from the bond portion 340 to the wire portion 360. The gap 370 has a portion 371 within the heel portion 350. Additionally, the gap 370 may further widen in the wire portion 360 moving away from the heel portion 350. The rate at which the gap widens in the wire portion 360 may be according to a loop profile.

The heel portion 350 may be mechanically weaker than the bond portion 340 or the wire portion 360. As a result, a heel crack 380 can form in the heel portion 350. A heel crack 380 may be split (i.e., fissure) in the heel material ranging from a modest penetration (e.g., <1% penetrations) to a complete breakage (i.e., 100% penetration). Heel cracks can form under a variety of conditions in which the heel experiences a force, vibration, and/or shock.

The wire bond shown in FIG. 3 was made using a capillary having a tip face (i.e., face) defined by a single profile (e.g., a single face angle). As a result, the wire in the heel portion 350 can be flattened by more than 50% of a diameter of the wire, resulting in a weak point in the wire (e.g., as determined by a wire pull strength test). Additionally, when the face of the capillary has a single segment profile, the capillary may not be able to apply enough downward pressure to bond the heel portion. As a result, a gap 370 may form between substrate and the wire in the (mechanically weak) heel portion.

A semiconductor packaging process may include a molding step after wire-bonding. In the molding step, a mold compound (e.g., mold resin) can be used to encapsulate a wire-bond 300. The mold compound can be formulated from epoxy resins, poured over the wire bond, and hardened. The gap in the heel portion can allow for defects in the mold compound under the wire 310 in the heel portion 350 that is mechanically weaker. For example, a pocket of air or moisture may be formed in the gap that can create a force on the wire 310 (e.g., in a particular pressure/temperature). In some implementations, mold compound in the gap may create forces (e.g., during the molding process). Unfortunately, adjusting a loop profile to minimize the gap in the heel portion 350 may lead to a small radius bend in the wire that can also lead to cracking.

To remedy the issues associated with the wire-bond profile 330, a multi-segmented profile wire-bond profile 335 shown in FIG. 3 can instead be applied to the wire 310. The disclosed wire-bond profile 335 has bond profile characterized by a piecewise function. In other words, the wire-bond profile 335 can be described by multiple, adjacent segments of differently shaped profiles (in contrast to wire-bond profile 330). Each segment may be characterized by a thickness and an angle. The disclosed bond profile creates a heel portion 350 that can be thicker than described thus far (e.g., see FIG. 3). Additionally, the gap 370, and specifically, the portion 371 of the gap 370, in the heel portion 350 may be eliminated and an intermetallic bond of the bond portion can be extended into the heel portion. As a result, the disclosed wire-bond profile 335 can resist forces on the heel portion 350 that would otherwise cause cracks. In other words, the disclosed wire-bond profile 335 is crack resistant. Additionally, the disclosed multi-segment wire-bond profile 335 may not require any optimization of the looping parameter (e.g., to minimize a gap) as a preventive measure against cracking because the gap 370 (and portion 371) in the heel portion 350 can be eliminated.

Figure 4:
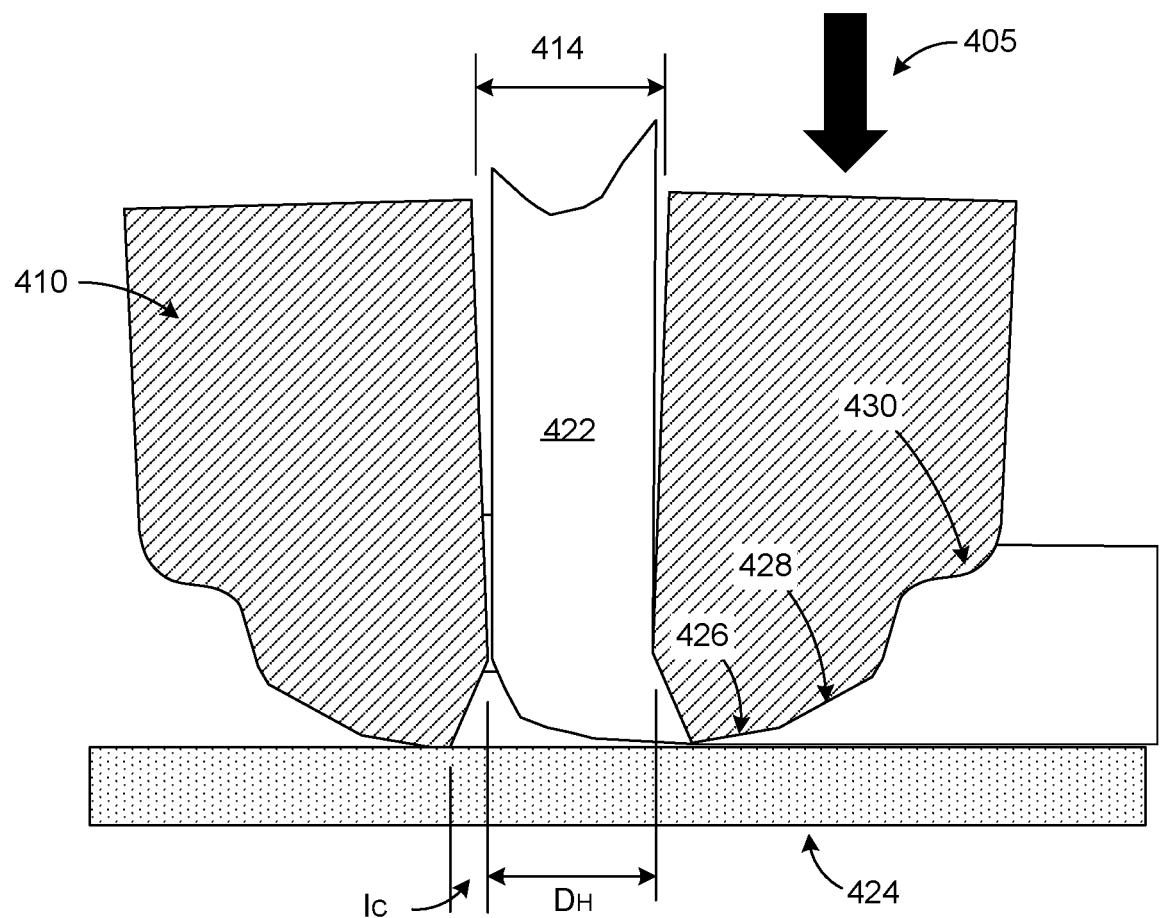
FIG. 4 illustrates a side, cross-sectional view of a multifaceted capillary creating a multi-segment wire-bond according to an implementation of the present disclosure.

FIG. 4 is a side cross-sectional view of a possible capillary for a wire-bonding machine having a profile characterized by multiple segments. Each having a distinct profile (i.e., a multifaceted profile). The distinct multifaceted profile can be used to form the wire-bond profile 335 shown in, for example, FIG. 3 and as described in the profiles below. As shown, during wire-bonding, the multifaceted capillary 410 applies a downward force 405 to press a wire 422 against a substrate 424 (e.g., lead post). A wire 422 can be fed (e.g., moved) through an entry hole 414 and through a tip hole, $D_H$, that has an inner chamfer, $I_C$. Applying power (e.g., ultrasonic power and/or heat power) and pressure (i.e., bond force, force) for a given bond period (i.e., bonding time), can form a bond profile according to a shape of the bottom surface (i.e., tip face) of the multifaceted capillary. The multiple face profiles of the multifaceted capillary can be configured to generate a wire-bond (e.g., wire-bond profile 335 shown in FIG. 3) that is resistant to cracking (i.e., a multi-segment wire-bond). The multifaceted capillary 410 can include three faces or profile portions: a first face 426, a second face 428, and a third face 430. Each of the three faces is associated with a different segment. The first face 426 can be associated with a first segment, the second face 428 can be associated with a second segment, and the third face 430 can be associated with a third segment. Although each of the segments and the profiles are described in more detail in connection with at least FIGS. 5 through 7.

It is noted that the aspects of the multi-segment wire-bond profiles that are described herein correspond directly with the profile features of the multifaceted capillary 410. Accordingly, to the extent that they are not described directly in connection with the multifaceted capillary 410 the features of the multi-segment wire-bond profiles can be attributed to the multifaceted capillary 410.

Figure 5:
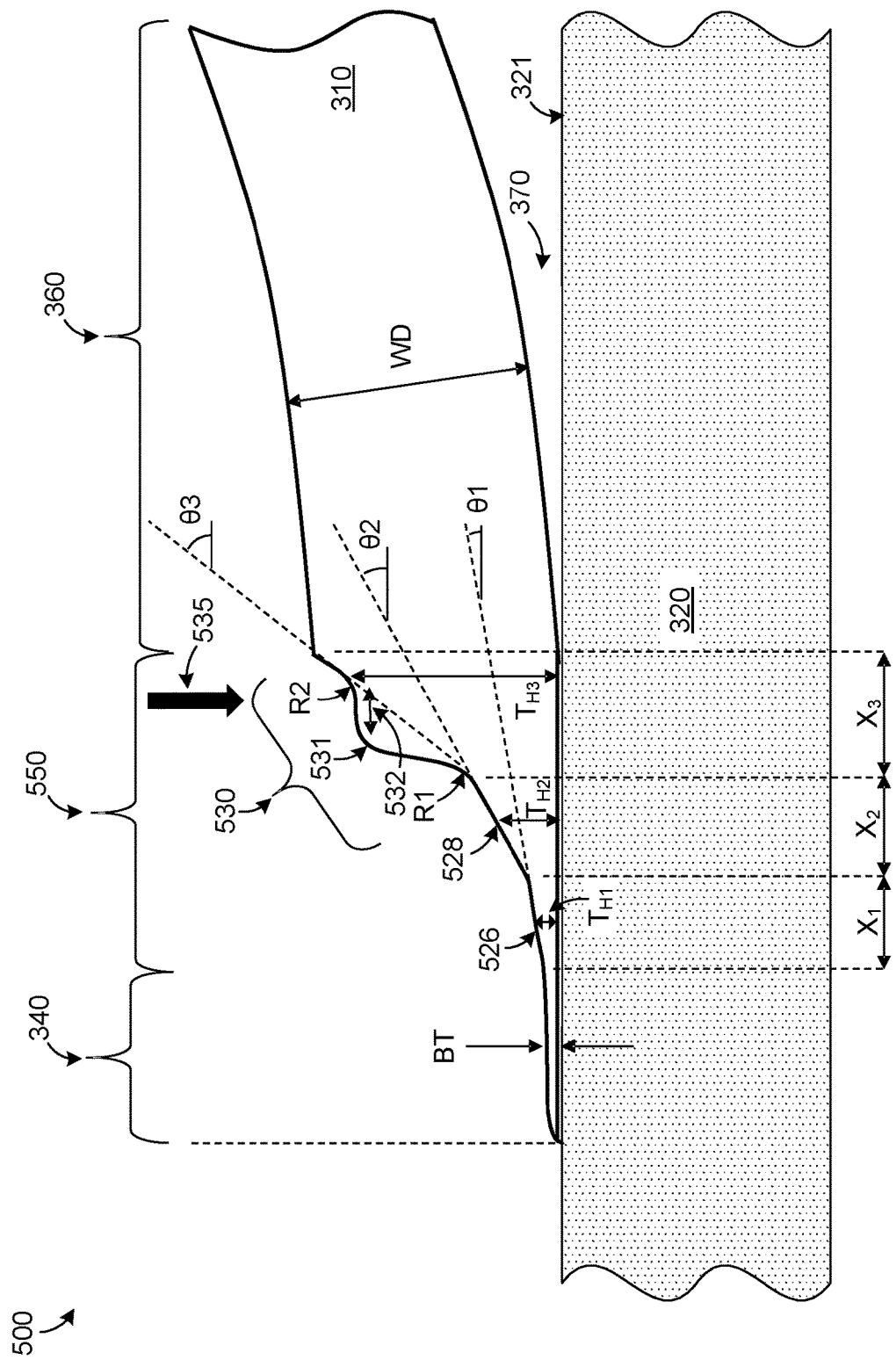
FIG. 5 illustrates a side, cross-section view of a multi-segment wire-bond according to an implementation of the present disclosure.

FIG. 5 illustrates a side cross-sectional view of a multi-segment wire-bond according to a possible implementation of the present disclosure. As before, the wire-bond (i.e., stitch) includes a bond portion 340 and a wire portion 360. A heel portion 550 of the multi-segment wire-bond 500, however, includes multiple segments. For example, the heel portion 550 can include a first segment 526, a second segment 528, and a third segment 530. The first segment 526 corresponds to a first segment length $X_1$, the second segment 528 corresponds to a second segment length, $X_2$, and the third segment 530 corresponds to a third segment length $X_3$. The segment lengths may be the same or different. The multiple segments can combine to form a heel portion 550 that is longer and that has an average thickness over a heel length (i.e., $X_1+X_2+X_3$) that is larger than a single segment heel portion (e.g., see FIG. 3). The increased average thickness can add strength to the heel portion. The first segment 526 is disposed (e.g., laterally disposed) between the bond portion 340 and the second segment. The second segment 528 is disposed between the first segment 526 and the third segment 530. The third segment 530 is disposed between the second segment 528 and the wire portion 360.

As shown in FIG. 5, a first segment 526 of the heel portion 550 may have a first profile that increases linearly in thickness from the bond portion 340 to the second segment 528 of the heel portion. In other words, the first profile can be a linear increase from a bond thickness (BT) of a bond portion 340 that is adjacent to the first segment 526 to a second thickness at the (adjacent) second segment 528. The linear increase of the first profile is characterized by a first face angle ($\theta 1$). A second segment 528 of the heel portion may have a second profile that increases linearly in thickness from the first segment 526 to the third segment 530 of the heel portion 550. In other words, the second profile can be a linear increase from the second thickness to a third thickness at the adjacent third segment 530. The linear increase of the second profile may be characterized by a second face angle (θ2). The third segment 530 of the heel portion may have a third profile that is more complex than the first or second profile. For example, the third profile may be characterized by a third face angle (θ3), a first radius of curvature (i.e., first radius, $R_1$) and a second radius of curvature (i.e., second radius, $R_2$). In other words, a linear increase of the third profile according to the third face angle (θ3) may be disrupted by a curve 531 (e.g., protrusion) defined, at least in part, by the first radius ($R_1$) and the second radius ($R_2$). In other words, the curve 531 defines a protrusion that extends outward from a plane along the third face angle (θ3) that extends between an end of the second segment 528 (to an interface between the second segment 528 and the third segment 530) and an end of the third segment 530 (to an interface between the third segment 530 and the wire portion 360). Accordingly, the third segment 530 has multiple inflections or curves that are described in more detail below.

The lengths of the segments are defined by inflections (e.g., interfaces, bends) between the segments. For example, the length $X_1$ (and first segment 526) is defined by an inflection between the bond portion 340 and first segment 526, and an inflection between the first segment 526 and the second segment 528. The length $X_2$ (and second segment 528) is defined by an inflection between the first segment 526 and the second segment 528, and an inflection between the second segment 528 and the third segment 530. The length $X_3$ (and third segment 530) is defined by an inflection between the second segment 528 and the third segment 530, and an inflection between the third segment 530 and a wire portion 360.

In some implementations, the curve 531 is curved in a direction opposite that of the first radius ($R_1$) and the second radius ($R_2$). For example, when viewed as shown in FIG. 5, the first radius ($R_1$) is shaped (e.g., curved) in a concave direction and the second radius ($R_2$) is also shaped (e.g., curved) in a concave direction. The curve 531 is curved (e.g.,) in a convex direction. As another example, when viewed as shown in FIG. 5, the first radius ($R_1$) and the second radius ($R_2$) define inflections points curving in a first direction and the curve 531 defines an inflection point curving in a second direction opposite the first direction. In some implementations, the curve 531 can be associated with a curved region or associated with a protrusion of the third segment 530. In some implementations, the curve 531 can define a surface of a protrusion that protrudes from the third segment 530 between the first radius ($R_1$) and the second radius ($R_2$).

The curve 531 can increase an average thickness of the third segment 530 and more generally can increase an average thickness of the heel portion 550. In other words, the curve 531 can defined a curved surface of a curved region so that the heel portion 550 has an average thickness that is greater than without the curve 531 (and curved region).

This curve 531 may define a plateau region 532 that is aligned (e.g., has a top surface that is aligned with or substantially aligned) with a bonding surface 321 of the substrate 320. In other words, the third profile can include an increase from the third thickness to a wire thickness (i.e., wire diameter, WD) of a wire portion 360 that is adjacent to the third segment. The third profile includes a curve 531 defined by a first radius ($R_1$) and a second radius ($R_2$) and the curve defines a plateau region 532 in the third segment 530. The plateau region 532 is close to the wire portion 530 because the third segment 530 is adjacent to the wire portion 360. In some implementations, the plateau region 532 can have a top surface that is parallel with (e.g., substantially parallel with) the bonding surface 321 of the substrate 320.

The plateau region 532 of the third segment 530 may be formed by a downward force 535 that is substantially vertical. A downward force 535 at this position during bonding may reduce or eliminate the gap 370 (or a portion thereof) in the heel portion 550. The gap 370 may remain in the wire portion 360 but because this portion can be mechanically stronger than the heel portion 550, it is forces emanating from the gap 370 are less likely to cause a crack. Additionally, the downward force 535 in this position during bonding may form an intermetallic bond between the wire and all or part of the heel portion 550. In other words, the third segment 530 can be bonded to the bonding surface 321 of the substrate 320 in, at least, an area corresponding to (e.g., under) the plateau region 532 of the third segment 530.

As shown in FIG. 5, each segment may be characterized by a thickness (e.g., average thickness over a segment's length). A first heel thickness, $T_{H1}$, may correspond to a first segment 526, a second heel thickness $T_{H2}$ may correspond to a second segment 528, and a third heel thickness $T_{H3}$ may correspond to a third segment 530. The first, second, and third heel thicknesses may increase as a transition is made between a bond thickness, BT, and a wire thickness (i.e., wire diameter, WD). At boundaries between segments the thickness of the portions may be equal so that the bond profile is not discontinuous (i.e., has no discontinuities) over the heel portion 550. Accordingly, each segment may increase in thickness over its segment length (i.e., $T_{H1}<T_{H2}<T_{H3}$). The amount (i.e., rate) of increase in thickness for each segment may be different and may correspond to the face angle for the segment. In this implementation, the thicknesses $T_{H1}$, $T_{H2}$, $T_{H3}$ are distances orthogonal to the bonding surface 321.

The multi-segment wire-bond 500 with a multi-segment heel portion may not require any looping parameter optimization to a make zero landing during loop payout because the bond profile can conform to most loop profiles. In a wire-bonding process a zero landing of the multifaceted capillary after a wire loop is formed can create a wire-bond having no gap (e.g., is continuous) between the heel and the substrate (i.e. lead frame), which eliminate bends in the wire which could cause damage to the heel portion. In other words, the bonding between the wire-bond 500 and the bonding surface 321 of the substrate 320 is continuous to an interface between the wire portion 360 and the third segment 530. Said differently, a bottom surface of the third segment 530 is entirely bonded (e.g., continuously bonded) to the bonding surface 321 of the substrate 320. A starting portion of the wire portion 360 (which has the thickness WD of the wire 310) is bonded to the bonding surface 321 of the substrate 320 without a gap. The multifaceted capillary is shaped to press the heel portion that creates a fusing between heel portion and the substrate (e.g., lead frame) surface to prevent a mold compound from penetrating in the gap (under the third segment 530) during mold process. The multi-segment wire-bond can have a longer and thicker heel (regardless of a second bond parameter applied) due to the multiple segments.

Figure 6:
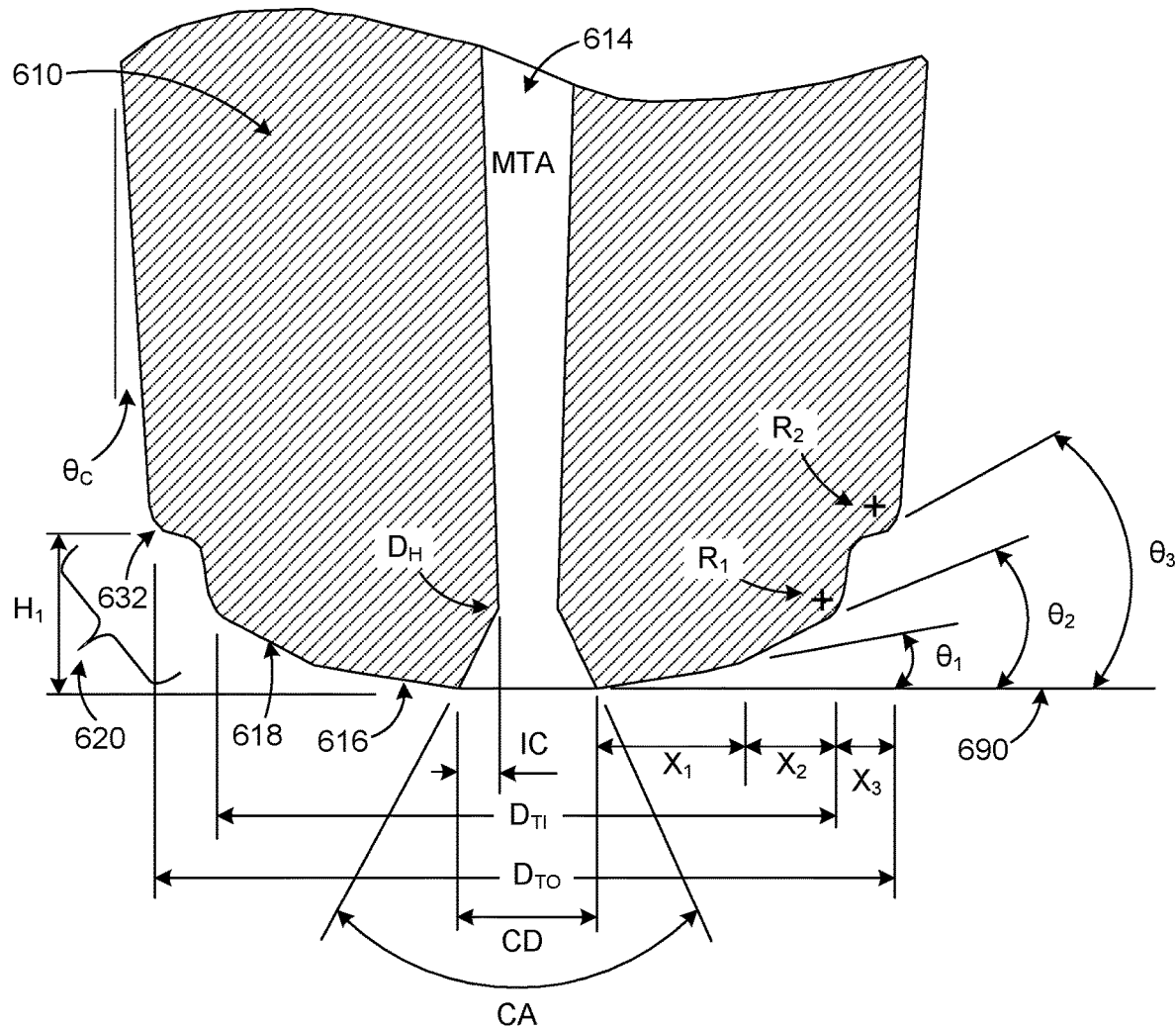
FIG. 6 illustrates a side, cross-section view of a multifaceted capillary according to an implementation of the present disclosure.

FIG. 6 is a detailed cross-section view of a multifaceted capillary according to an implementation of the present disclosure. The multifaceted capillary 610 may be a bottle or standard neck type capillary. The multifaceted capillary 610 can be a material suitable for the requirements (e.g., heat, pressure) of wire-bonding, such as ceramic or stone (e.g., ruby). The capillary may be configured with a polished or matte surface finish that aids in a wire bonding process (e.g., can reduce a residue on the capillary between stitches. The multifaceted capillary 610 can interface with a wire (not shown) using a wire channel 614 including a tip hole ($D_H$) and an inner chamfer (IC). The wire channel may also be characterized by a main taper angle (MTA) and chamfer angle (CA), The multifaceted capillary 610 has a tip face (i.e., bottom surface) that is shaped according to a multifaceted profile. In the implementation shown in FIG. 6, the multifaceted profile substantially matches (e.g., is identical to) a wire-bond profile of the implementation of the multi-segment wire-bond shown in FIG. 5. In other words, the bottom surface of the multifaceted capillary defines a first face 616, a second face 618, and a third face 620. The first face 616, which is adjacent to (i.e., between) the second face 618 and the inner chamfer (IC) can be pressed on the wire to form the first segment 526 of the heel portion 550 of the multi-segment wire-bond. The second face 618, which is adjacent to (i.e., between) the first face 616 and the third face 620, can be pressed on the wire 310 to form the second segment 528 of the heel portion 550 of the multi-segment wire-bond. The third face 620, which is adjacent to the second face 618, can be pressed on the wire 310 to form the third segment 530 of the heel portion of the wire-bond.

As shown in FIG. 6, the first face 616 can have a first face profile that includes a first surface at a first face angle ($\theta 1$) with a bonding surface 690. The second face 618 can have a second face profile that includes a second surface at a second face angle ($\theta 2$) with the bonding surface 690. The third face 620 can have a third face profile that is more complex than the first face profile and/or the second face profile. For example, the third face profile may be characterized by a third face angle ($\theta 3$), a first radius of curvature ($R_1$) and a second radius of curvature ($R_2$). In other words, a third profile may include a third surface at the third face angle ($\theta 3$) plus a curve formed by (i.e., defined by) the first radius of curvature ($R_1$) and a second radius of curvature ($R_2$). This curve may define a plateau region 632 that is substantially aligned (e.g., 0°≤alignment angle≤1°) with the bonding surface 690. Accordingly, a downward pressure in the plateau region 632, during wire-bonding, may be higher than in other portions of the capillary face. As a result, multifaceted capillary may be able to apply a force sufficient to bond an area corresponding to (i.e., under) the plateau region, which can be very close to the wire portion (i.e., wire loop) of a wire bond connection. This added bond area can increase strength and close a gap under the heel portion. In other words, a downward force applied to the capillary may be transferred to the wire with force components (e.g., a downward force component and a lateral force component) related to the face profile. For example, face profile that is more aligned with the bonding surface (i.e., more horizontal) can transfer a greater downward force component than a profile that is less aligned with the bonding surface (i.e., more vertical). Accordingly, the third face may apply a greater downward force component (i.e., greater force) than the first face or the second face during wire-bonding because of the plateau region. In other words, because of the plateau region, a third force applied by the third face on a wire during wire-bonding is larger than a first force applied by the first face on the wire during wire-bonding or a second force applied by the second face on the wire during wire-bonding.

As shown in FIG. 6, the first face 616 corresponds to a first face length $X_1$, the second face 618 corresponds to a second face length $X_2$, and a third face 620 corresponds to a third face length $X_3$. The multifaceted capillary is sized according to an inner tip diameter ($D_{TI}$) and an outer tip diameter ($D_{TO}$). The first face 616, the second face 618, and the third face 620 can define a height ($H_1$). The height ($H_1$) can be less than the wire diameter (WD) of the wire, which can be less than 3 mils. For example, the wire diameter (WD) may be 1 mil or 2 mils. In one possible implementation, the inner tip diameter ($D_{TI}$) is greater than, or equal to, four mils (i.e., $D_{TI}$≥4 mils), while the outer tip diameter ($D_{TO}$) is less than, or equal to, six mils (i.e., $D_{TO}$≤6 mils) and a cone angle $\theta_C$ that is greater than, or equal to, twenty degrees (i.e., $\theta_C$≥20°).

In a possible implementation, the first face 616 of the multifaceted capillary, as shown in FIG. 6, can be inclined less than, or equal to, four degrees with respect to the bonding surface 690 (e.g., 0°≤$\theta_1$≤4°). The second face 618 can be inclined less than, or equal to, eight degrees with the bonding surface 690 (e.g., 4°≤$\theta_2$≤8°). The third face 620 can be inclined greater than, or equal to approximately ten degrees (i.e., $\theta_3$≥10°) with respect to the bonding surface 690 (e.g., $\theta_3$=15°±2°) and include a curve formed with a first radius $R_1$ that is less than, or equal to, 0.5 mils (i.e., $R_1$≤0.5 mils) and a radius $R_2$ in a range of 0.5 to 1.0 mils (i.e., 0.5≤$R_2$≤1.0 mils). The first face 616 can define a distance ($X_1$) that is less than, or equal to, 0.6 mils from the intersection of chamfer angle (CA) and chamfer diameter (CD) (i.e., $X_1$≤0.6 mils). The second face 618 can define a distance ($X_2$) that is greater than, or equal to, 0.75 mils from the end point of the first face 616 (i.e., $X_2$≥0.75 mils). The third face 620 may define a distance ($X_3$) that is less than, or equal to, 1 mil from the end point of the second face 618 (i.e., $X_3$≤1 mils). Additionally, a cone angle ($\theta_C$) of the multifaceted capillary, as shown in FIG. 6, may be between 15 and 25 degrees (i.e., 15°≤$\theta_C$≤20°).

Figure 7:
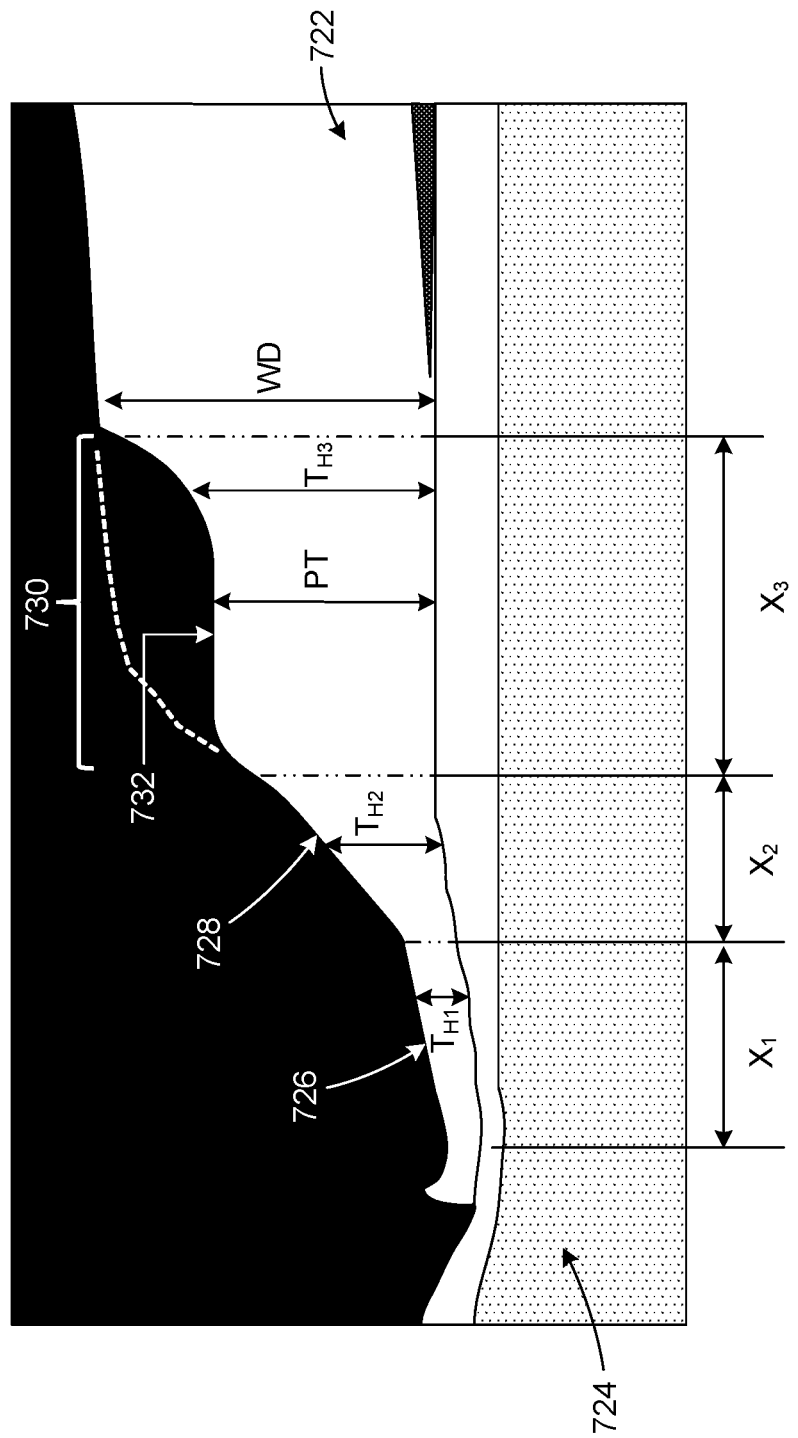
FIG. 7. is a side cross section photo of a multi-segment wire-bond according to an implementation of the present disclosure.

FIG. 7 is a photo of a cross-section of a multi-segment wire-bond according to an implementation of the present disclosure. The wire 722 in the multi-segment wire-bond has a diameter of 1 mil. The multi-segment wire-bond includes a first segment 726, a second segment 728, and a third segment (i.e., neck segment 730) formed by an impression made by the multifaceted capillary during a wire bonding process including an application of ultrasonic power and an application of a bonding force for a bonding time (i.e., period) and at a bonding temperature. In the implementation shown, $R_1$ is large. As a result, there is little observable inflection between the second segment 728 and the neck segment. No gap is observable between a lead frame 724 and wire 722 along the neck segment 730 of the heel portion. Instead, the lead frame 724 surface and wire 722 are fused (i.e., bonded) along an area of 732 under a plateau region 732. The plateau region 732 is formed in the wire (see dotted line) by a force (e.g., downward force component) that, when combined with other bonding parameters (e.g., heat, time, ultrasonic power, etc.) during wire-bonding, acts to close the gap and fuse the wire to the lead frame. The fusing may prevent lifting of the wire in this area. Additionally, the fusing and the thickness ($T_{H3}$) in the neck segment 730 strengthens the multi-segment wire-bond to prevent heel cracks and to improve a wire pull strength (e.g., as measured by a pull-test of the wire 722). For example, the plateau region may have a thickness (PT) that is at least 50% of the diameter of the wire (i.e., PT≥0.5·WD). Additionally, the elimination of the gap prevents mold resin from penetrating into this region. The thickness in the heel portion (e.g. $T_{H3}$) can be at least 70 percent wire diameter (i.e., $T_{H3}$≥0.7·WD), which may be thicker than single segment wire-bonds (e.g., see FIG. 3). The added thickness may correspond to an added strength.

FIG. 8 is a flowchart of a method for wire-bonding. The method 800 includes feeding 810 a wire through a wire channel of a multifaceted capillary (e.g., see FIG. 6) of a wire-bonding machine (e.g., see FIG. 1). The method further includes applying 820 a force to press the wire between a bottom surface of the multifaceted capillary and a bonding surface of a substrate (e.g., see FIG. 4). The method further includes delivering 830 power (e.g., ultrasonic power) to the wire to form a multi-segment wire-bond with no gap between the bonding surface and a heel portion (e.g., see FIG. 5). The heel portion includes a plateau region that has a thickness (PT) that is more than half the diameter of the wire (WD) (e.g., see FIG. 7).

Semiconductor manufacturing (e.g., of integrated circuits, power devices, etc.) may experience failures because of in ball bonding. A broken heel a wire-bond (i.e., stitch) may occur during fabrication (e.g., immediately after wire bonding), during a package stress test (e.g., during reliability testing), or during field use (e.g., after board mounting). While the disclosed multifaceted capillary and the resulting multi-segment wire-bond may be useful for any wire-bonding process, it may be especially useful to a ball bonding process using a copper wire or a gold wire having a wire diameter, such as 1 mils or 2 mils.

With a corresponding set of wire bonding parameters to provide a repeatable wire-bonding process a crack-resistant wire-bond may be incorporated in semiconductor device production to prevent most, if not all causes, of cracked or broken stitch heels, thus providing efficiencies in cost and time.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A method for wire-bonding comprising:
   feeding a wire through a wire channel of a multifaceted capillary of a wire-bonding machine;
   applying a force to press the wire between a bottom surface of the multifaceted capillary and a bonding surface of a substrate, the bottom surface including:
      a first face, adjacent to a wire channel, having a first face profile that includes a first surface at a first face angle with the bonding surface;
      a second face, adjacent to the first face, having a second face profile that includes a second surface at a second face angle with the bonding surface; and
      a third face, adjacent to the second face, having a third face profile that includes a curve having a plateau region that is substantially aligned with the bonding surface, wherein the force includes a first force applied by the first face on the wire, a second force applied by the second face on the wire, and a third force applied by the third face on the wire, the third force being larger than the first force or the second force; and
   delivering a power to the wire to raise a temperature of the wire, the raised temperature and the force forming a multi-segment wire-bond.

2. The method for wire-bonding according to claim 1, wherein the multi-segment wire-bond has no gap between the bonding surface and a heel portion.

3. The method for wire-bonding according to claim 2, wherein the heel portion of the multi-segment wire-bond includes a plateau region having a thickness that is greater than or equal to half of a diameter of the wire.

4. The method for wire-bonding according to claim 2, further comprising:
   adding mold compound to the multi-segment wire-bond without mold compound under the heel portion of the multi-segment wire-bond.

5. The method for wire-bonding according to claim 1, wherein:
   the power is ultrasonic power.

6. The method for wire-bonding according to claim 1, wherein:
   the first surface is at a first angle that is greater than zero degrees and less than or equal to approximately 4 degrees; and
   the second surface is at a second face angle that is greater than approximately 4 degrees and less than or equal to approximately 8 degrees.

7. The method for wire-bonding according to claim 1, wherein:
the curve is defined by a first radius and a second radius; and
the third face includes a third surface at a third face angle plus the curve defined by the first radius and the second radius.

8. The method for wire-bonding according to claim 7, wherein:
the third face angle is greater than or equal to 15 degrees;
the first radius is less than or equal to 0.5 mils; and
the second radius is greater than or equal to 0.5 mils and less than or equal to 1 mils.

9. The method for wire-bonding according to claim 1, wherein:
the first face has a first face length that is less than or equal to 0.6 mils;
the second face has a second face length that is greater than or qual to 0.75 mils; and
the third face has a third face length that is less than or equal to 1 mils.

10. The method for wire-bonding according to claim 1, wherein:
the first face, the second face, and the third face define a height that is less than a diameter of the wire.

11. The method for wire-bonding according to claim 1, wherein:
a diameter of the wire is 1 mil or 2 mils.

12. A method for wire-bonding comprising:
feeding a wire through a wire channel of a multifaceted capillary of a wire-bonding machine;
applying a force to press the wire between a bottom surface of the multifaceted capillary and a bonding surface of a substrate, the bottom surface including:
a first face, adjacent to a wire channel, having a first face profile that includes a first surface at a first face angle with the bonding surface;
a second face, adjacent to the first face, having a second face profile that includes a second surface at a second face angle with the bonding surface; and
a third face, adjacent to the second face, having a third face profile that includes a curve having a plateau region that is substantially aligned with the bonding surface; and
delivering power to the wire to raise a temperature of the wire, the raised temperature and the force forming a multi-segment wire-bond, the multi-segment wire-bond including:
a first segment that increases from a first thickness to a second thickness according to a first side cross-sectional profile over a first segment length;
a second segment that increases from the second thickness to a third thickness according to a second side cross-sectional profile over a second segment length, the second side cross-sectional profile being different from the first side cross-sectional profile; and
a third segment that increases from the third thickness to a fourth thickness according to a third side cross-sectional profile over a third segment length, the third side cross-sectional profile being different from the second side cross-sectional profile and the first side cross-sectional profile.

13. The method for wire-bonding according to claim 12, wherein:
the first side cross-sectional profile is a substantially linear increase from a bond thickness to the second thickness over the first segment length.

14. The method for wire-bonding according to claim 12, wherein:
the second side cross-sectional profile is a substantially linear increase from the second thickness to the third thickness over the second segment length.

15. The method for wire-bonding according to claim 12, wherein:
the third side cross-sectional profile includes the curve having the plateau region that is substantially aligned with the bonding surface.

16. The method for wire-bonding according to claim 15, wherein:
the curve increases an average thickness of the third side cross-sectional profile over the third segment length.

17. The method for wire-bonding according to claim 12, wherein:
the plateau region has a plateau thickness that is greater than or equal to 50% of a diameter of the wire.

18. The method for wire-bonding according to claim 12, further including:
a bond portion, adjacent to the first segment that is bonded to a bonding surface of a substrate; and
a wire portion adjacent to the third segment such that the third segment is disposed between the wire portion and the second segment, the wire portion having a bottom surface not bonded to the bonding surface of the substrate.

19. A method for wire-bonding comprising:
applying a force to press a wire between a bottom surface of a multifaceted capillary and a bonding surface of a substrate, the bottom surface including:
a first face, adjacent to a wire channel, having a first face profile that includes a first surface at a first face angle with the bonding surface;
a second face, adjacent to the first face, having a second face profile that includes a second surface at a second face angle with the bonding surface; and
a third face, adjacent to the second face, having a third face profile that includes a curve having a plateau region that is substantially aligned with the bonding surface; and
delivering a power to the wire to raise a temperature of the wire, the raised temperature and the force forming a multi-segment wire-bond including the plateau region defined by the curve of the third face.

20. The method for wire-bonding according to claim 19, wherein the force includes:
a first force applied by the first face on the wire,
a second force applied by the second face on the wire, and
a third force applied by the third face on the wire, the third force being larger than the first force or the second force.

* * * * *